(12) United States Patent
Mitsui

(10) Patent No.: US 10,755,997 B2
(45) Date of Patent: Aug. 25, 2020

(54) COOLING DEVICE AND MOUNTING METHOD

(71) Applicant: NEC CORPORATION, Tokyo (JP)

(72) Inventor: Tomoyuki Mitsui, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/786,869

(22) Filed: Oct. 18, 2017

(65) Prior Publication Data

US 2018/0114738 A1 Apr. 26, 2018

(30) Foreign Application Priority Data

Oct. 24, 2016 (JP) .................................. 2016-207729

(51) Int. Cl.
*H01L 23/367* (2006.01)
*H01L 23/467* (2006.01)
*H05K 7/20* (2006.01)

(52) U.S. Cl.
CPC ........ *H01L 23/3672* (2013.01); *H01L 23/467* (2013.01); *H05K 7/20* (2013.01)

(58) Field of Classification Search
CPC . H01L 23/3672; H01L 23/467; H01L 23/427; H01L 23/4006; H01L 23/473; H01L 2023/4087; H01L 2924/0002; H05K 7/20; H05K 7/20254; H05K 7/20145; H05K 7/20154; G06F 1/20; G06F 2200/201; F28D 1/024; F28D 1/0408; F28D 9/0234; F28D 15/00

USPC ............. 361/717, 700, 679.46–679.54, 695, 361/698–702, 704, 715, 719, 723; 165/80.1–80.5, 104.33; 174/15.1, 16.3
See application file for complete search history.

(56) References Cited

U.S. PATENT DOCUMENTS

| 6,179,046 | B1 * | 1/2001 | Hwang | H01L 23/467 165/121 |
| 9,917,029 | B2 * | 3/2018 | Liu | H01L 23/36 |
| 2005/0146023 | A1 | 7/2005 | Edwards | |
| 2006/0187643 | A1 * | 8/2006 | Tsurufusa | H05K 7/2049 361/704 |
| 2009/0059525 | A1 * | 3/2009 | Peng | H01L 23/427 361/697 |
| 2010/0078154 | A1 * | 4/2010 | Li | F28D 15/0275 165/104.31 |

(Continued)

FOREIGN PATENT DOCUMENTS

| JP | 2003-124663 A | 4/2003 |
| JP | 2005-166815 A | 6/2005 |

(Continued)

OTHER PUBLICATIONS

Japanese Office Action 2016-207729, dated Sep. 26, 2017.

*Primary Examiner* — Daniel P Wicklund
*Assistant Examiner* — Amir A Jalali
(74) *Attorney, Agent, or Firm* — Sughrue Mion, PLLC

(57) ABSTRACT

A cooling device comprises a frame and a heat radiating portion. The frame is mounted on a substrate, and includes a convex portion for cooling the substrate. The heat radiating portion is mounted on the frame at a position associated with a heating component located on the substrate. The convex portion assists positioning where the heat radiating portion is mounted.

16 Claims, 7 Drawing Sheets

(56) References Cited

U.S. PATENT DOCUMENTS

| | | | |
|---|---|---|---|
| 2010/0165566 A1* | 7/2010 | Li | G06F 1/20 |
| | | | 361/679.47 |
| 2010/0165573 A1* | 7/2010 | Fang | G06F 1/20 |
| | | | 361/697 |
| 2010/0271774 A1* | 10/2010 | Peng | H01L 23/427 |
| | | | 361/679.52 |
| 2011/0063802 A1* | 3/2011 | Chen | H05K 7/20154 |
| | | | 361/709 |
| 2011/0090647 A1* | 4/2011 | Li | H01L 23/427 |
| | | | 361/697 |
| 2011/0157833 A1* | 6/2011 | Bohannon | H01L 23/4006 |
| | | | 361/709 |
| 2012/0063088 A1* | 3/2012 | Fu | G06F 1/20 |
| | | | 361/697 |
| 2013/0042998 A1* | 2/2013 | Chen | F28F 3/06 |
| | | | 165/67 |
| 2014/0353460 A1* | 12/2014 | Lee | H01L 23/4006 |
| | | | 248/672 |
| 2015/0070837 A1* | 3/2015 | Hsu | G06F 1/20 |
| | | | 361/679.47 |
| 2016/0106003 A1* | 4/2016 | Bosak | H05K 7/20336 |
| | | | 361/700 |

FOREIGN PATENT DOCUMENTS

| | | |
|---|---|---|
| JP | 2007-517407 A | 6/2007 |
| JP | 2016-178212 A | 10/2016 |

* cited by examiner

5

COOLING DEVICE AND MOUNTING METHOD

This application is based upon and claims the benefit of priority from Japanese Patent Application No. 2016-207729, filed on Oct. 24, 2016, the disclosure of which is incorporated herein in its entirety by reference.

TECHNICAL FIELD

The embodiments of the present invention relate to a cooling device and a mounting method, and more particularly to a cooling device capable of cooling a heating component on a substrate.

BACKGROUND ART

In order to efficiently cool a heating component such as a semiconductor package (chip) being a heating element, a heat sink is mounted above the heating component such as the semiconductor package.

As a technique to be used when a heat sink is mounted, for example, there is known PTL 1. PTL 1 discloses a heat sink holder for a semiconductor package, which includes a heat sink holder portion for holding a heat sink, and a leg portion extending from the heat sink holder portion and fixed to a substrate. The heat sink holder portion in PTL 1 is located on an upper surface of a semiconductor package when the leg portion is fixed to the substrate. Further, the heat sink holder portion includes an opening in a bottom portion thereof. The opening is used when the heat sink and the semiconductor package are adhered to each other. According to PTL 1, it is possible to use an opening on an inner side of a frame portion to be formed by the heat sink holder portion, as an area where an adhesive agent is coated, when the heat sink holder for the semiconductor package is used. Thereby, an adhesive layer of a size depending on the opening is formed when the heat sink is fixed. Consequently, PTL 1 makes it possible to mount a heat sink without exerting a compressive force which may affect heat transfer on the adhesive layer.

Further, as a related technique, there is known PTL 2. PTL 2 discloses a system including a spring arm device connected to a substrate and including an opening portion capable of passing a package on the substrate, and a heat sink. The spring arm device in PTL 2 includes at least one spring arm extending from an inner end of the opening portion. The spring arm includes a heat sink clip at a distal end thereof. The heat sink clip has a shape capable of holding a heat sink post in which the heat sink is formed. Further, by causing the spring arm to hold the heat sink post, the heat sink and at least one package are connected. PTL 2 is capable of increasing a calorific value that is releasable.

CITATION LIST

Patent Literature

[PTL 1]: Japanese Laid-open Patent Publication No. 2005-166815

[PTL 2]: Japanese Translation of PCT International Publication No. 2007-517407

As disclosed in PTL 2, a frame (a flange) being a frame for reinforcing a substrate such as a spring arm device may be connected on the substrate, and a heat sink may be mounted on the frame. In a case where a heat sink is mounted on a frame, when a mounting position of the heat sink is displaced, a thermal interface material such as grease coated on the heat sink may adhere to an unintended portion on the frame. Further, the frame itself in PTL 2 does not have a function for cooling a heating component on a substrate. Therefore, it is difficult to cool a heating member on a substrate other than a heating member to be cooled by a heat sink.

As described above, in a case where a flange is used, there is a problem that it is difficult to specify a mounting position of a heat sink by a simplified method, while securing a sufficient cooling performance with respect to a heating member on a substrate.

Further, the heat sink holder portion in PTL 1 is formed only in the periphery of a semiconductor package. Therefore, even when the technique disclosed in PTL 1 is used, it is difficult to cool a heating member on a substrate other than a semiconductor package where the heat sink holder portion is formed.

An object of the present invention is to provide a cooling device that enables to specify a mounting position of a heat sink by a simplified method, while securing a sufficient cooling performance.

SUMMARY

An exemplary object of embodiments of the present invention is to provide a cooling device for cooling a heating component on a substrate.

Another exemplary object of embodiments of the present invention is to provide a mounting method of a cooling device for cooling a heating component on a substrate.

According to a non-limiting illustrative embodiment, a cooling device including:

a frame which is mounted on a substrate, the frame including a convex portion for cooling the substrate; and a heat radiating portion which is mounted on the frame at a position associated with a heating component located on the substrate, wherein the convex portion assists positioning where the heat radiating portion is mounted.

According to another non-limiting illustrative embodiment, a mounting method which mounts a heat radiating portion, on a frame forming a convex portion for cooling the substrate to be mounted on a substrate, at a position associated with a heating component located on the substrate, the mounting method comprising:

a mounting the heat radiating portion on the frame with use of the convex portion.

BRIEF DESCRIPTION OF THE DRAWINGS

Other features and advantages of various embodiments of the present invention will become apparent by the following detailed description and the accompanying drawings, wherein.

EXEMPLARY EMBODIMENT

A first exemplary embodiment of the present invention will be described in detail below.

Figure 1:
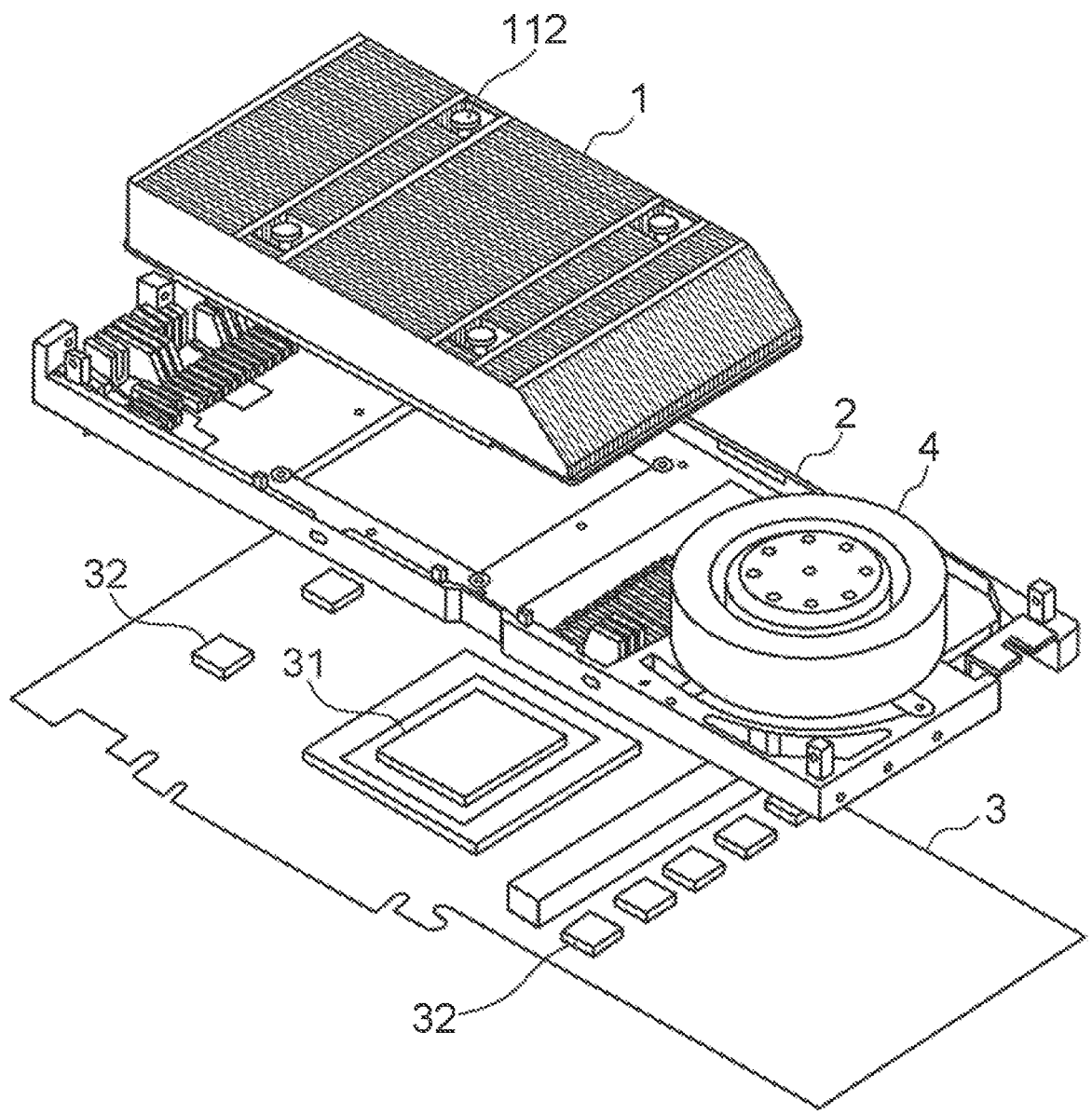
FIG. 1 is a diagram illustrating an example of an overall configuration in a first exemplary embodiment of the present invention.
Figure 2:
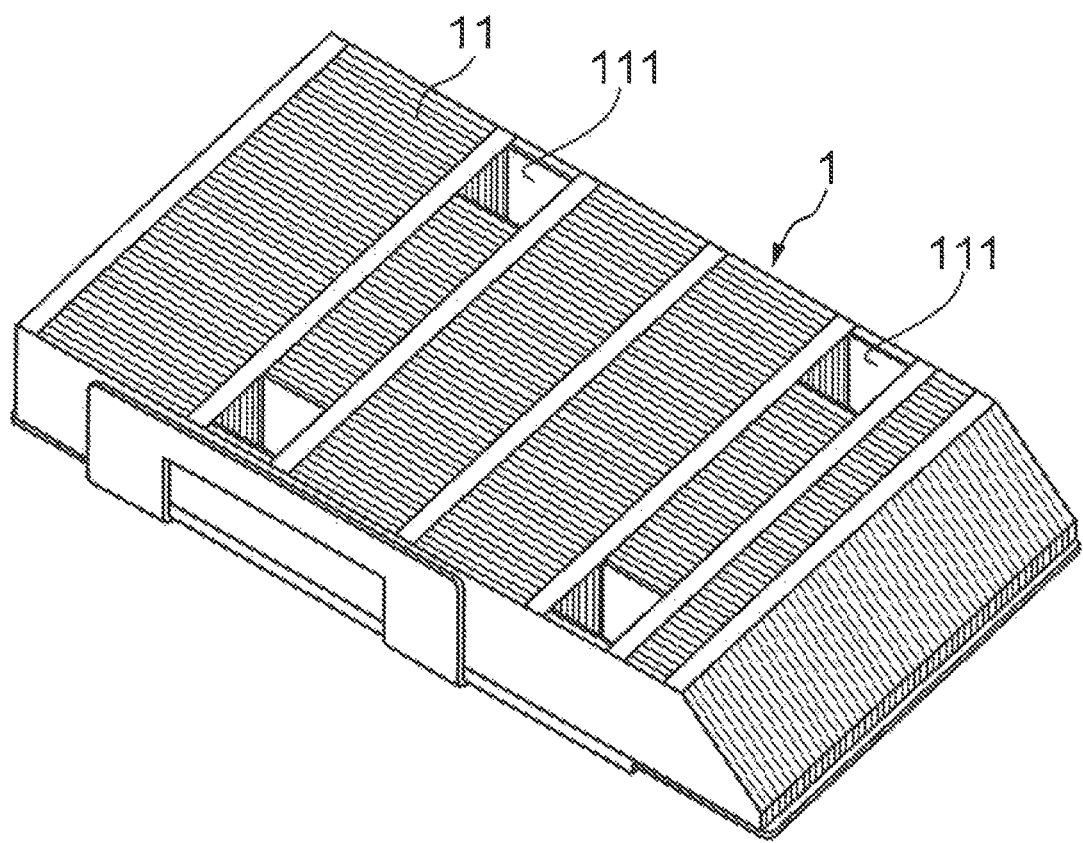
FIG. 2 is a perspective view illustrating an example of a shape of a heat sink illustrated in FIG. 1.
Figure 3:
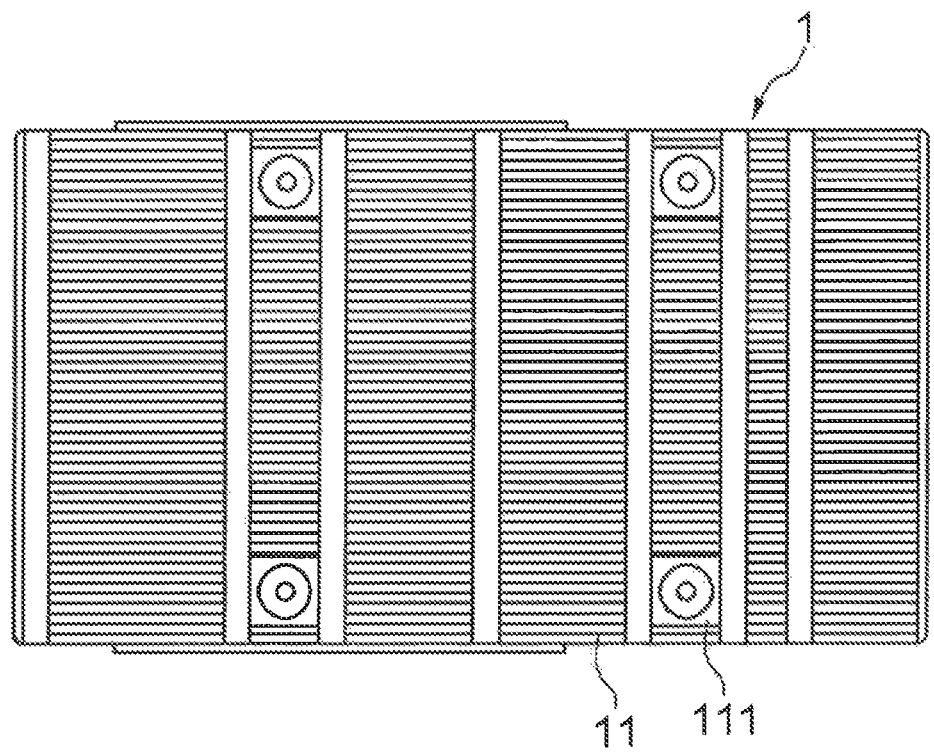
FIG. 3 is a plan view illustrating the example of the shape of the heat sink illustrated in FIG. 1.
Figure 4:
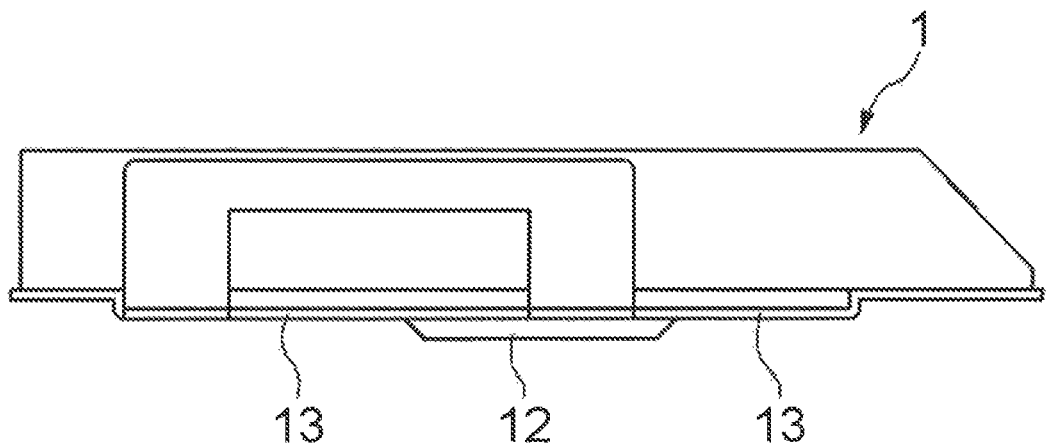
FIG. 4 is a side view illustrating the example of the shape of the heat sink illustrated in FIG. 1.
Figure 5:
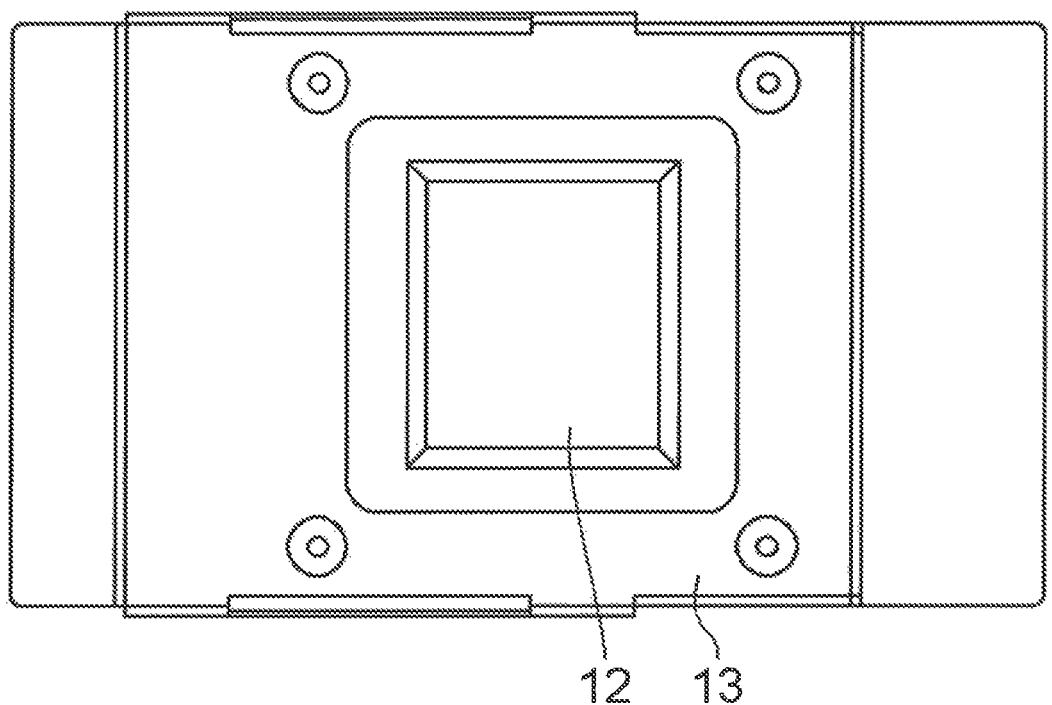
FIG. 5 is a bottom view illustrating the example of the shape of the heat sink illustrated in FIG. 1.
Figure 6:
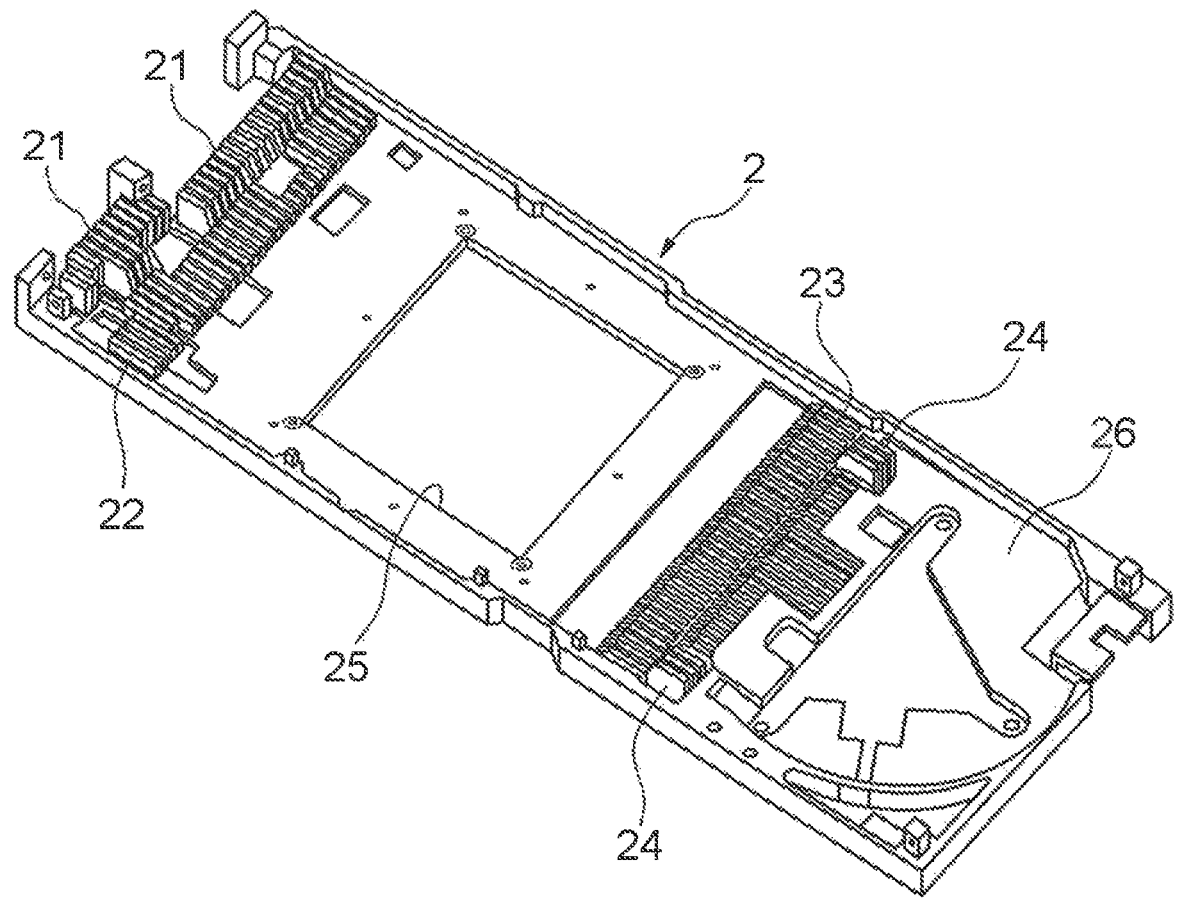
FIG. 6 is a perspective view illustrating an example of a shape of a frame illustrated in FIG. 1.
Figure 7:
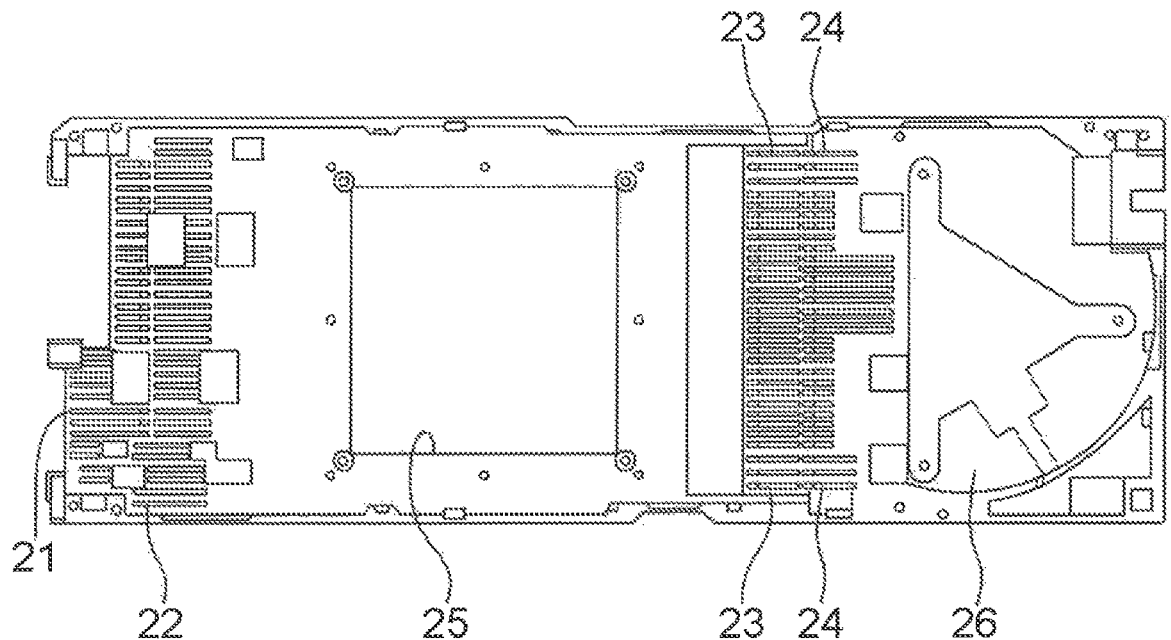
FIG. 7 is a plan view illustrating the example of the shape of the frame illustrated in FIG. 1.
Figure 8:
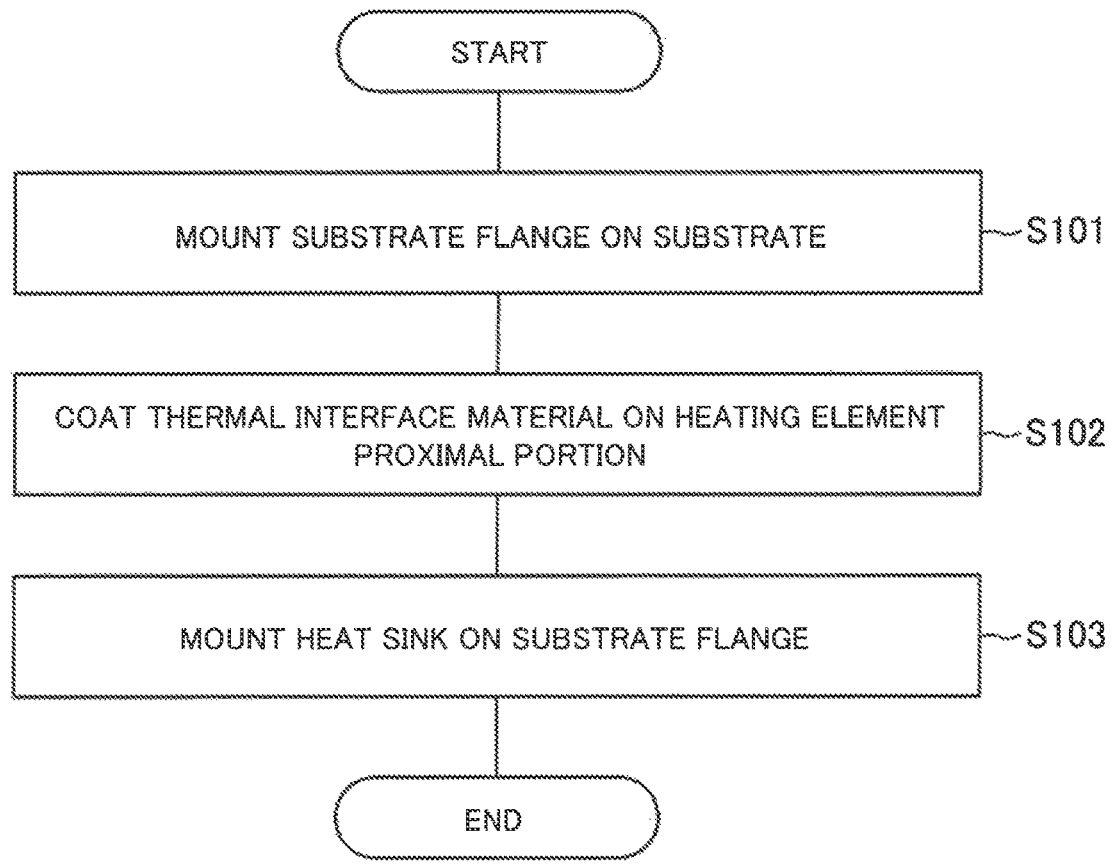
FIG. 8 is a flowchart for describing an example of a mounting method.

The first exemplary embodiment of the present invention is described referring to FIG. 1 to FIG. 7. FIG. 1 is a diagram illustrating an example of an overall configuration in the first exemplary embodiment. FIG. 2 is a perspective view illustrating an example of a shape of a heat sink 1. FIG. 3 is a plan view illustrating the example of the shape of the heat sink 1. FIG. 4 is a side view illustrating the example of the shape of the heat sink 1. FIG. 5 is a bottom view illustrating the example of the shape of the heat sink 1. FIG. 6 is a perspective view illustrating an example of a shape of a frame 2. FIG. 7 is a plan view illustrating the example of the shape of the frame 2. FIG. 8 is a flowchart for describing an example of a mounting method.

The first exemplary embodiment of the present invention is described regarding a cooling device to be mounted on a substrate 3. The cooling device in the exemplary embodiment includes the heat sink 1 (heat radiating portion), the flange 2 (frame), and a fan 4. The flange 2 includes a convex portion having a projecting shape such as a flange fin on the outer side of the mounting position of the heat sink 1 on the flange 2. The flange 2 as a function of cooling the substrate 3 and heating elements 32 on the substrate 3. Further, the convex portion formed on the outer side of the mounting position of the heat sink 1 on the flange 2. The convex portion assists positioning where the heat sink 1 is mounted.

Referring to FIG. 1, the overall configuration in the exemplary embodiment includes the heat sink 1, the flange 2, the substrate 3, and the fan 4. The flange 2 is a frame to be mounted on the substrate 3. Further, the heat sink 1 and the fan 4 are mounted on the flange 2.

Note that the following description is made based on the premise that a thickness direction of the heat sink 1 in FIG. 1 is an up-down direction. For example, in a case of FIG. 1, the flange 2 is mounted on upper surface of the substrate 3. Further, in a case of FIG. 1, the heat sink 1 and the fan 4 are mounted on upper surface of the flange 2. Further, the following description is made based on the premise that the side in FIG. 1 where the fan 4 is mounted is a front side, and the side in FIG. 1 where the heat sink 1 is mounted is a rear side. For example, in a case of FIG. 1, the fan 4 is mounted on the front side of the flange 2. Further, the heat sink 1 is mounted on the rear side of the flange 2.

The heat sink 1 is mounted on the flange 2. The heat sink 1 cools the heating element 31 on the substrate 3. As illustrated in FIG. 1 and FIG. 2, the heat sink 1 includes a heat sink fin 11 constituted by a plurality of parallel plate members. Air generated by the fan 4 passes through between the plurality of plate members constituting the heat sink fin 11. For example, the plurality of plate members constituting the heat sink fin 11 extend in the same direction as the direction of air generated by the fan 4 so that the plate members do not block the air generated by the fan 4 as much as possible.

A through-hole 111 is formed at predetermined four positions on the heat sink 1 (see FIG. 2 and FIG. 3). The through-hole 111 extend through the heat sink 1 in an up-down direction being a thickness direction of the heat sink 1. As illustrated in FIG. 1, a screw 112 passes through each through-hole 111. After the heat sink 1 is disposed at a mounting position on the flange 2, the heat sink 1 is fixed to the flange 2 by the screws 112.

As illustrated in FIG. 3, the shape of the heat sink 1 is a substantially rectangular shape in a plan view. Further, as illustrated in FIG. 4, when the heat sink 1 is viewed from a side, the heat sink 1 includes a connecting portion 12 being a first convex portion and a vapor chamber portion 13 being a second convex portion on the lower side thereof. In this way, the heat sink 1 has a substantially trapezoidal shape or a quadrangular prismatic shape when viewed from a side, for example.

The connecting portion 12 (a heat-radiating-portion-side first convex portion) is constituted by a metal member. When the heat sink 1 is mounted on the flange 2, the connecting portion 12 is located at a position above the heating element 31 (a heating component) on the substrate 3. When the heat sink 1 is mounted on the flange 2, the connecting portion 12 comes into contact with the heating element 31 via a thermal interface material (TIM) coated on the connecting portion 12.

Further, in the exemplary embodiment, the connecting portion 12 is located at such a position that the distance from a front end of the heat sink 1 (a right end in FIG. 4 and FIG. 5) to the connecting portion 12, and the distance from a rear end of the heat sink 1 (a left end in FIG. 4 and FIG. 5) to the connecting portion 12 are different from each other. Specifically, the connecting portion 12 is formed at a position displaced from a central portion of the heat sink 1. Herein, as described above, when the heat sink 1 is mounted on the flange 2, the connecting portion 12 is located at a position above the heating element 31 on the substrate 3. Therefore, when the flange 2 is mounted on the substrate 3, and the heat sink 1 is mounted on the flange 2, the distance from the front end of the heat sink 1 to the heating element 31, and the distance from the rear end of the heat sink 1 to the heating element 31 are different from each other. Note that the distance from the front end of the heat sink 1 to the heating element 31 may be shorter or longer than the distance from the rear end of the heat sink 1 to the heating element 31.

The vapor chamber portion 13 (a heat-radiating-portion-side second convex portion) implements efficient cooling by repeating vaporization and liquefaction of a cooling liquid filled inside the vapor chamber portion 13. For example, a cooling liquid is filled in an inner lower portion of the vapor chamber portion 13. A cooling liquid is vaporized by heat from the heating element 31. Thereafter, the vaporized vapor moves toward the heat sink fin 11 within the vapor chamber portion 13. Then, the vaporized vapor is cooled and liquefied. Then, the liquefied liquid flows into the inner lower portion of the vapor chamber portion 13 again. By repeating the aforementioned phenomenon, the vapor chamber portion 13 implements efficient cooling.

Note that as illustrated in FIG. 4, the vapor chamber portion 13 projects downwardly from a bottom surface of the heat sink 1. Further, the connecting portion 12 projects downwardly from the vapor chamber portion 13. In other words, the connecting portion 12 is located at a lowermost position of the heat sink 1. Further, the vapor chamber portion 13 is located on the upper side of the connecting portion 12. In this way, convex portions projecting in two steps are formed on the lower side of the heat sink 1 (on the side where the heat sink 1 is mounted on the flange 2), for example.

The flange 2 is made of a material having a good heat dissipation efficiency such as aluminum, for example. The substrate 3 is reinforced by mounting the flange 2 on the substrate 3. The heat sink 1 and the fan 4 are mounted on the flange 2. The heating element 31 on the substrate 3 are cooled by the heat sink 1, the fan 4, and the like. Further, the flange 2 in the exemplary embodiment includes a flange fin being a convex portion, which will be described later. The flange fin cools the substrate 3, and heating elements 32 on the substrate 3 (heating elements which come into contact with the heat sink 1 other than the heating element 31).

Referring to FIG. 6 and FIG. 7, the shape of the flange 2 is a substantially rectangular shape in a plan view. Further, the flange 2 includes a first flange fin 21 (corresponding to a convex portion), a second flange fin 22 (corresponding to a second convex portion), a third flange fin 23 (corresponding to a second convex portion), and a fourth flange fin 24 (corresponding to a convex portion). The first flange fin 21, the second flange fin 22, the third flange fin 23, and the fourth flange fin 24 are located at positions above the heating elements 32 on the substrate 3 when the flange 2 is mounted on the substrate 3. The first flange fin 21, the second flange fin 22, the third flange fin 23, and the fourth flange fin 24 cool the substrate 3, and the heating elements 32 on the substrate 3. Further, the flange 2 includes an opening portion 25 extending through the flange 2 in an up-down direction, and configured to receive the heating element 31 on the substrate 3 and the connecting portion 12. Further, the flange 2 includes a fan mounting portion 26 where the fan 4 is mounted. Note that the first flange fin 21, the second flange fin 22, the third flange fin 23, and the fourth flange fin 24 may be formed at positions other than the positions above the heating elements 32 on the substrate 3 when the flange 2 is mounted on the substrate 3.

The first flange fin 21 and the fourth flange fin 24 are constituted by a plurality of parallel plate members. Air generated by the fan 4 passes through between the plurality of plate members constituting the first flange fin 21 and the fourth flange fin 24. For example, the plurality of plate members constituting the first flange fin 21 and the fourth flange fin 24 extend in the same direction as the direction of air generated by the fan 4 so that the plate members do not block the air generated by the fan 4 as much as possible.

The first flange fin 21 and the fourth flange fin 24 are located on the outer side of a mounting position of the heat sink 1 with respect to the flange 2. For example, the first flange fin 21 is formed on the rear side with respect to a position where the rear end of the heat sink 1 is located when the heat sink 1 is mounted on the flange 2. Further, the fourth flange fin 24 is formed on the front side with respect to a position where the front end of the heat sink 1 is located when the heat sink 1 is mounted on the flange 2.

In this way, the first flange fin 21 and the fourth flange fin 24 are formed at positions associated with the front end and the rear end of the heat sink 1. In other words, the first flange fin 21 and the fourth flange fin 24 are formed at least a part of positions corresponding to the outer shape of the heat sink 1. By forming the first flange fin 21 and the fourth flange fin 24 at positions associated with the front end and the rear end of the heat sink 1, the first flange fin 21 and the fourth flange fin 24 assist positioning where the heat sink 1 is mounted. For example, when the heat sink 1 is attempted to be mounted from the front side with respect to a predetermined mounting position, the heat sink 1 and the fourth flange fin 24 come into contact with each other. On the other hand, when the heat sink 1 is attempted to be mounted from the rear side with respect to a predetermined mounting position, the heat sink 1 and the first flange fin 21 come into contact with each other. In other words, the heat sink 1 is mounted at a mounting position located between the first flange fin 21 and the fourth flange fin 24. In this way, by forming the first flange fin 21 and the fourth flange fin 24 at positions where the heat sink 1 comes into contact with the first flange fin 21 or the fourth flange fin 24 when the heat sink 1 is attempted to be mounted at a position displaced from a predetermined mounting position, for example, it is possible to assist positioning where the heat sink 1 is mounted.

Further, as described above, the first flange fin 21 and the fourth flange fin 24 are located at positions above the heating elements 32 on the substrate 3 when the flange 2 is mounted on the substrate 3. By forming the first flange fin 21 and the fourth flange fin 24 as described above, the first flange fin 21 and the fourth flange fin 24 are capable of cooling the substrate 3, the heating elements 32 on the substrate 3, and the like.

Note that as described above, the distance from the front end of the heat sink 1 to the heating element 31, and the distance from the rear end of the heat sink 1 to the heating element 31 are different from each other when the flange 2 is mounted on the substrate 3, and the heat sink 1 is mounted on the flange 2. Therefore, the distance from the first flange fin 21 to the heating element 31, and the distance from the fourth flange fin 24 to the heating element 31 are different from each other when the flange 2 is mounted on the substrate 3. In other words, one of the convex portion is nearer than other of the convex portion when the frame includes a plurality of the convex portions. Further, the opening portion 25 is formed in the flange 2 at a position above the heating element 31 on the substrate 3 when the flange 2 is mounted on the substrate 3. According to the aforementioned configuration, when the connecting portion 12 of the heat sink 1 is attempted to be placed into the opening portion 25 in a state that the front side and the rear side of the heat sink 1 are reversed (in other words, in a state that the right side in FIG. 2 corresponds to the rear side), the heat sink 1 comes into contact with the first flange fin 21 or the fourth flange fin 24. In other words, it is not possible to mount the heat sink 1 on the flange 2 in a state that the front side and the rear side of the heat sink 1 are reversed.

Further, in the exemplary embodiment, the first flange fin 21 and the fourth flange fin 24 have the same height. For example, it is desirable to secure a height of the first flange fin 21 to such an extent that the connecting portion 12 does not come into contact with the flange 2 when a part of the heat sink 1 comes into contact with the first flange fin 21, and an end of the heat sink 1 comes into contact with the flange 2. In other words, when the heat sink 1 is attempted to be mounted at a position displaced from a mounting position of the heat sink 1, a lower portion of the heat sink 1 and the first flange fin 21 (or the fourth flange fin 24) come into contact with each other. In a case where the connecting portion 12 of the heat sink 1 comes into contact with the flange 2 when a lower portion of the heat sink 1 and the first flange fin 21 come into contact with each other, a thermal interface material coated on the connecting portion 12 may adhere to the flange 2. In order to eliminate the aforementioned inconvenience, it is desirable to secure a sufficient height of the first flange fin 21 to such an extent that the connecting portion 12 does not come into contact with the flange 2 when the heat sink 1 is attempted to be mounted at a position displaced from a mounting position of the heat sink 1 (in other words, when a lower portion of the heat sink 1 and the first flange fin 21 come into contact with each other, for example). The same configuration as described above is also desirable for the fourth flange fin 24, as well as the first flange fin 21. In this way, it is desirable such that the heights of the first flange fin 21 and the fourth flange fin 24 have predetermined heights depending on the height of the connecting portion 12. Note that the heights of the first flange fin 21 and the fourth flange fin 24 may be different from each other.

The second flange fin 22 and the third flange fin 23 are constituted by a plurality of parallel plate members, as well as the first flange fin 21 and the fourth flange fin 24. Each of the second flange fin 22 and the third flange fin 23 is formed into a projecting shape. Air generated by the fan 4 passes through between the plurality of plate members constituting the second flange fin 22 and the third flange fin 23. For example, the plurality of plate members constituting the second flange fin 22 and the third flange fin 23 extend in the same direction as the direction of air generated by the fan 4 so that the plate members do not block the air generated by the fan 4 as much as possible. In this way, for example, the second flange fin 22 and the third flange fin 23 are constituted by a plurality of plate members extending in the same direction as the heat sink fin 11, the first flange fin 21, and the fourth flange fin 24.

The second flange fin 22 and the third flange fin 23 are formed on the inner side of a mounting position of the heat sink 1 on the flange 2. Further, the second flange fin 22 and the third flange fin 23 are formed on the outer side with respect to a position where the vapor chamber portion 13 is located when the heat sink 1 is mounted on the flange 2. For example, the second flange fin 22 is formed on the rear side with respect to a position where a rear end of the vapor chamber portion 13 is located, and on the front side of the first flange fin 21 when the heat sink 1 is mounted on the flange 2. Further, for example, the third flange fin 23 is formed on the front side with respect to a position where a front end of the vapor chamber portion 13 is located, and on the rear side of the fourth flange fin 24 when the heat sink 1 is mounted on the flange 2.

In this way, the second flange fin 22 and the third flange fin 23 are formed at positions associated with the front end and the rear end of the vapor chamber portion 13.

Further, as described above, the second flange fin 22 and the third flange fin 23 are located at positions above the heating elements 32 on the substrate 3 when the flange 2 is mounted on the substrate 3. By forming the second flange fin 22 and the third flange fin 23 at positions as described above, the second flange fin 22 and the third flange fin 23 are capable of cooling the substrate 3, and the heating elements 32 on the substrate 3.

Note that the second flange fin 22 and the third flange fin 23 have the same height, for example. The second flange fin 22 and the third flange fin 23 have heights depending on the height of the vapor chamber portion 13 when viewed from a bottom surface of the heat sink 1. Specifically, the second flange fin 22 and the third flange fin 23 have heights lower than the height of the vapor chamber portion 13 when viewed from a bottom surface of the heat sink 1. According to the aforementioned configuration, it is possible to mount the heat sink 1 on the flange 2 without coming into contact with the second flange fin 22 and the third flange fin 23. Note that the second flange fin 22 and the third flange fin 23 may have different heights. Further, the second flange fin 22 or the third flange fin 23 may come into contact with the heat sink 1 when the heat sink 1 is mounted on the flange 2.

Note that the heights of the second flange fin 22 and the third flange fin 23 are lower than the heights of the first flange fin 21 and the fourth flange fin 24.

The opening portion 25 is a through-hole for receiving the heating element 31 on the substrate 3 when the flange 2 is mounted on the substrate 3. For example, the opening portion 25 is a through-hole extending through the flange 2 in an up-down direction being a thickness direction of the flange 2, and formed into a rectangular shape in a plan view. The opening portion 25 has a size depending on the size of the heating element 31, for example. The opening portion 25 is formed in the flange 2. The opening portion 25 is formed at a position above the heating element 31 on the substrate 3 when the flange 2 is mounted on the substrate 3. The opening portion 25 may have a function of suppressing leakage of a thermal interface material such as grease coated between the heating element 31 and the connecting portion 12.

Note that as described above, the distance from the front end of the heat sink 1 to the heating element 31, and the distance from the rear end of the heat sink 1 to the heating element 31 are different from each other when the flange 2 is mounted on the substrate 3, and the heat sink 1 is mounted on the flange 2. Further, the flange 2 includes the opening portion 25 for receiving the heating element 31 on the substrate 3 when the flange 2 is mounted on the substrate 3. According to the aforementioned configuration, the distance from the first flange fin 21 to the opening portion 25, and the distance from the fourth flange fin 24 to the opening portion 25 are different from each other when the heat sink 1 is mounted on the flange 2. In other words, the first flange fin 21 and the fourth flange fin 24 are formed at positions whose distances from the opening portion 25 are different from each other.

Note that as described above, the first flange fin 21 is located on the rear side with respect to a position where the rear end of the heat sink 1 is located. Further, the fourth flange fin 24 is located on the front side with respect to a position where the front end of the heat sink 1 is located.

The fan 4 is mounted on the fan mounting portion 26. The fan mounting portion 26 has a shape depending on the shape of the fan 4, and is capable of mounting the fan 4. In the exemplary embodiment, the fan mounting portion 26 is formed on the front side with respect to the fourth flange fin 24 on the flange 2.

The foregoing is an example of a configuration of the flange 2. Note that in the exemplary embodiment, the flange 2 also includes, in a lateral direction of the flange 2, a convex portion for assisting positioning where the heat sink 1 is mounted at a position on the outer side of the heat sink 1 when the heat sink 1 is mounted.

The substrate 3 includes the heating element 31 and the heating elements 32 such as a semiconductor package and various chips. The flange 2 is mounted on the substrate 3. Note that the heating element 31 and the heating elements 32 illustrated in FIG. 1 are merely an example. For example, a plurality of unillustrated heating elements 32 may be formed on the substrate 3. In this way, the numbers and the locations of the heating element 31 and the heating elements 32 to be formed on the substrate 3 are not limited to the case illustrated in FIG. 1.

The fan 4 cools the heat sink 1 by feeding air to the heat sink 1. Further, the first flange fin 21, the second flange fin 22, the third flange fin 23, and the fourth flange fin 24 are cooled by air generated by the fan 4. In the exemplary embodiment, the fan 4 has a cylindrical shape. The shape of the fan 4, however, is not specifically limited to a cylindrical shape. The fan 4 is mounted on the fan mounting portion 26 of the flange 2.

The foregoing is description about each element of the exemplary embodiment.

Next, an example of an operation when each element described in the exemplary embodiment is mounted is described referring to FIG. 8.

Referring to FIG. 8, the flange 2 is mounted on the substrate 3 (Step S101). Subsequently, a thermal interface material such as grease is coated on the connecting portion 12 (Step S102). Thereafter, the heat sink 1 coated with the thermal interface material is mounted on the flange 2 (Step S103).

Each element is mounted on each element by the aforementioned procedure, for example. Note that the process of Step S102 may be performed before the process of Step S101. Further, the process of mounting the fan 4 on the flange 2 may be performed before the process of Step S101, or may be performed between Step S101 and Step S102, or may be performed between Step S102 and Step S103, or may be performed after Step S103.

As described above, in the exemplary embodiment, the first flange fin 21 and the fourth flange fin 24 are formed on the outer side of a mounting position of the heat sink 1 with respect to the flange 2. According to the aforementioned configuration, the first flange fin 21 and the fourth flange fin 24 assist positioning where the heat sink 1 is mounted. Further, the first flange fin 21 and the fourth flange fin 24 may have a function of cooling the substrate 3. Consequently, it is possible to specify a mounting position of the heat sink 1 by a simplified method, while securing a sufficient cooling performance. This makes it possible to mount the heat sink 1 at a mounting position without additionally providing a guide pin and the like for assisting positioning where the heat sink 1 is mounted. Thus, it is possible to securely prevent oozing and the like of a thermal interface material (grease) due to displacement of a mounting position of the heat sink 1.

Further, in the exemplary embodiment, the distance from the first flange fin 21 to the heating element 31, and the distance from the fourth flange fin 24 to the heating element 31 are different from each other when the flange 2 is mounted on the substrate 3, and the heat sink 1 is mounted on the flange 2. Further, the connecting portion 12 is formed at such a position that the distance from the front end of the heat sink 1 to the connecting portion 12, and the distance from the rear end of the heat sink 1 to the connecting portion 12 are different from each other. According to the aforementioned configuration, when the connecting portion 12 of the heat sink 1 is attempted to be placed in the opening portion 25 in a state that the front end and the rear end of the heat sink 1 are reversed, the heat sink 1 comes into contact with the first flange fin 21 or the fourth flange fin 24. Consequently, it is easy to prevent mounting the heat sink 1 in a state that the front end and the rear end of the heat sink 1 are reversed.

Further, according to the exemplary embodiment, the second flange fin 22 and the third flange fin 23 are formed at positions associated with the position where the vapor chamber portion 13 is located when the heat sink 1 is mounted on the flange 2. The aforementioned configuration makes it possible to enhance the cooling performance of the flange 2.

Note that in the exemplary embodiment, there is described a case where the first flange fin 21 and the fourth flange fin 24 are formed at positions associated with the front end and the rear end of the heat sink 1. Alternatively, the first flange fin 21 and the fourth flange fin 24 may be formed at positions where it is possible to assist positioning where the heat sink 1 is mounted. The first flange fin 21 and the fourth flange fin 24 are not necessarily formed on the front end and the rear end of the heat sink 1. For example, it is possible to form the first flange fin 21 and the fourth flange fin 24 at positions corresponding to the outer shape of the heat sink 1, such as a position associated with the front end of the heat sink 1, and a position associated with one of lateral ends of the heat sink 1. Further, the positions of the second flange fin 22 and the third flange fin 23 are not limited to the case exemplified in the exemplary embodiment. The second flange fin 22 and the third flange fin 23 may be formed in a lateral direction of the heat sink 1, for example.

Next, a second exemplary embodiment of the present invention will be described in detail. In the second exemplary embodiment, a summary of a configuration of a cooling device 5 is described.

Figure 9:
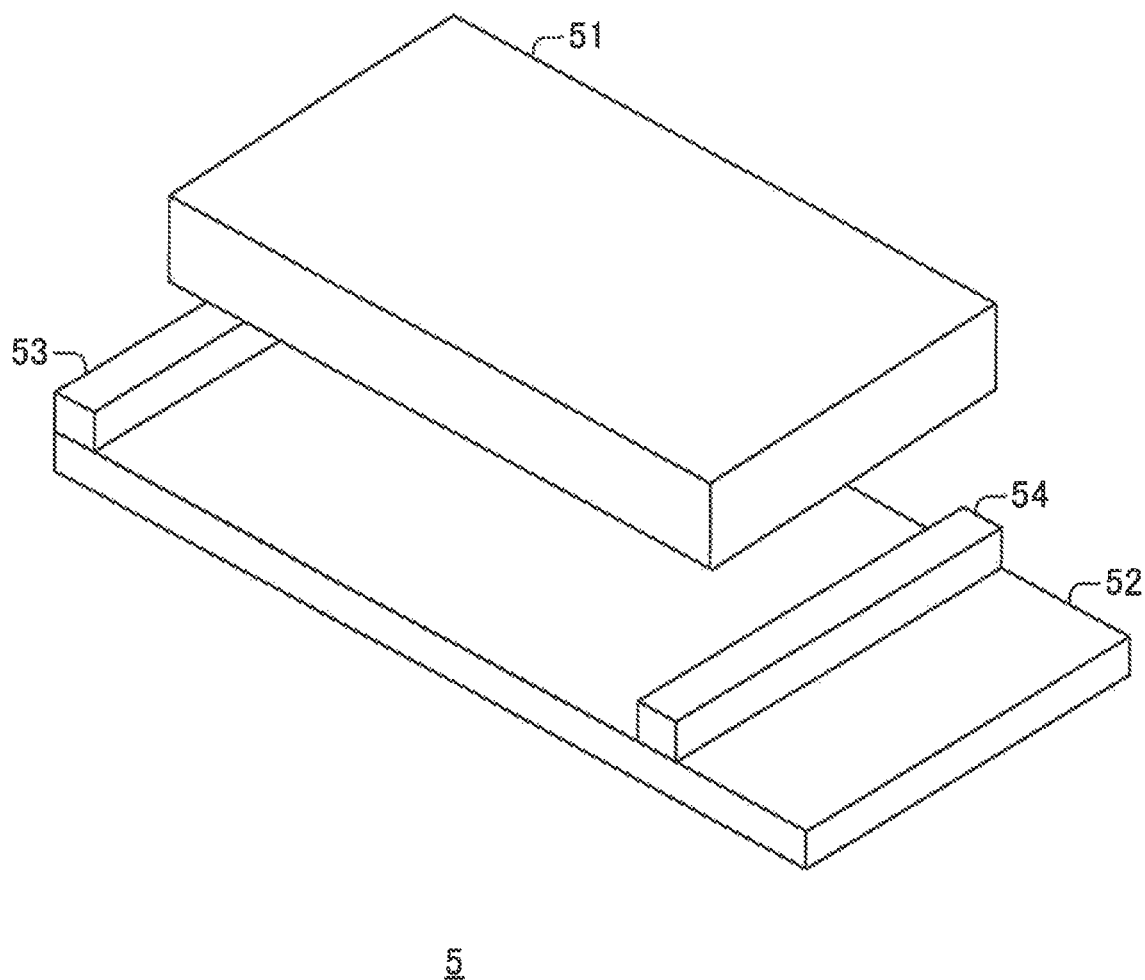
FIG. 9 is a schematic diagram illustrating an example of a configuration in a second exemplary embodiment of the present invention.

Referring to FIG. 9, the cooling device 5 includes a heat radiating portion 51, and a frame 52 to be mounted on a substrate.

The heat radiating portion 51 is mounted on the frame 52. The heat radiating portion 51 cools a heating component located on the substrate where the frame 52 is mounted.

The frame 52 includes a convex portion 53 and a convex portion 54. Specifically, the frame 52 includes, on the outer side of a mounting position of the heat radiating portion 51 with respect to the frame 52, the convex portions 53 and 54 for cooling the substrate and for assisting positioning where the heat radiating portion 51 is mounted.

As described above, the frame 52 of the cooling device 5 in the exemplary embodiment includes, on the outer side of a mounting position of the heat radiating portion 51 with respect to the frame 52, the convex portions 53 and 54 for cooling a substrate and for assisting positioning where the heat radiating portion 51 is mounted. According to the aforementioned configuration, it is possible to assist positioning of the heat radiating portion 51 by a convex portion having a cooling performance without newly providing a guide pin and the like. Consequently, it is possible to specify a mounting position of the heat sink 1 by a simplified method, while securing a sufficient cooling performance.

Note that in the exemplary embodiment, the convex portions 53 and 54 are formed on the frame 52. Alternatively, only one of the convex portions 53 and 54 may be formed. Further, the convex portions 53 and 54 may be formed in a lateral direction of the frame 52.

Further, the aforementioned mounting method for use when the cooling device 5 is mounted is a mounting method for mounting, on the frame 52 where a substrate is mounted, the heat radiating portion 51 for cooling a heating component located on the substrate, wherein a convex portion for cooling the substrate and for assisting positioning where the heat radiating portion 51 is mounted is formed on the outer side of a mounting position of the heat radiating portion 51 with respect to the frame 52, and the heat radiating portion 51 is mounted on the frame 52 in such a manner that the heat radiating portion 51 is located on the inner side of the convex portion.

Also, in the invention directed to the aforementioned mounting method, it is possible to accomplish the aforementioned objects of the present invention, because the invention has the same advantageous effects as the aforementioned cooling device 5.

<Supplementary Notes>

A part or all of the exemplary embodiments may also be described as the following supplementary notes. In the following, a summary of a cooling device and the like in the present invention is described. Note that the present invention is not limited to the following configuration.

[Supplementary Note 1]

A cooling device comprising:

a frame which is mounted on a substrate, the frame including a convex portion for cooling the substrate; and a heat radiating portion which is mounted on the frame at a position associated with a heating component located on the substrate, wherein the convex portion assists positioning where the heat radiating portion is mounted.

[Supplementary Note 2]

The cooling device according to claim 1, wherein the convex portion is formed on an outer side of a mounting position of the heat radiating portion on the frame.

[Supplementary Note 3]

The cooling device according to claim 1, wherein the frame includes an opening portion, and wherein the heat radiating portion is connected to the heating component via the opening portion of the frame.

[Supplementary Note 4]

The cooling device according to claim 2, wherein the frame includes an openiAng portion, and wherein the heat radiating portion is connected to the heating component via the opening portion of the frame.

[Supplementary Note 5]

The cooling device according to claim 3, wherein the frame includes a plurality of the convex portions, and wherein the plurality of the convex portions are formed at positions whose distances from the opening portion are different from each other.

[Supplementary Note 6]

The cooling device according to claim 4, wherein the frame includes a plurality of the convex portions, and wherein the plurality of the convex portions are formed at positions whose distances from the opening portion are different from each other.

[Supplementary Note 7]

The cooling device according to claim 1, wherein the heat radiating portion is a rectangular shape, wherein the frame includes the convex portions facing each other, respectively on outer sides of both ends of the heat radiating portion, and a distance from one of the convex portion to the heating component, and a distance from the other of the convex portion to the heating component are different from each other.

[Supplementary Note 8]

The cooling device according to claim 6, wherein the heat radiating portion is a rectangular shape, wherein the frame includes the convex portions facing each other, respectively on outer sides of both ends of the heat radiating portion, and a distance from one of the convex portion to the heating component and a distance from the other of the convex portion to the heating component are different from each other.

[Supplementary Note 9]

The cooling device according to claim 1, wherein the convex portion is a fin formed to project in such a manner that air to be fed by a fan is allowed to pass.

[Supplementary Note 10]

The cooling device according to claim 8, wherein the convex portion is a fin formed to project in such a manner that air to be fed by a fan is allowed to pass.

[Supplementary Note 11]

The cooling device according to claim 9, wherein the heat radiating portion includes a fin for the heat radiating portion, and wherein the fin for the heat radiating portion and the fin are formed in such a manner that air is allowed to pass in a same direction as a direction of air generated by the fan.

[Supplementary Note 12]

The cooling device according to claim 10, wherein the heat radiating portion includes a fin for the heat radiating portion, and wherein the fin for the heat radiating portion and the fin are formed in such a manner that air is allowed to pass in a same direction as a direction of air generated by the fan.

[Supplementary Note 13]

The cooling device according to claim 1, further comprising:

a second convex portion whose height is lower than a height of the convex portion is formed, on the frame, on an inner side of a mounting position of the heat radiating portion with respect to the frame.

[Supplementary Note 14]

The cooling device according to claim 13, wherein the heat radiating portion is formed at a position where the heating component is located when the heat radiating portion is mounted on the frame, the heat radiating portion including a heat-radiating-portion-side first convex portion for cooling the heating component, and a heat-radiating-portion-side second convex portion whose height is lower than a height of the heat-radiating-portion-side first convex portion, and wherein the second convex portion is formed on an outer side of a position where the heat-radiating-portion-side second convex portion is located when the heat radiating portion is mounted on the frame.

[Supplementary Note 15]

The cooling device according to claim 13, wherein the second convex portion is a fin formed to project in such a manner that air to be fed by a fan is allowed to pass.

[Supplementary Note 16]

The cooling device according to claim 14, wherein the second convex portion is a fin formed to project in such a manner that air to be fed by a fan is allowed to pass.

[Supplementary Note 17]

The cooling device according to claim 1, further comprising a heating component located on the substrate.

[Supplementary Note 18]

A mounting method which mounts a heat radiating portion, on a frame forming a convex portion for cooling a substrate to be mounted on a substrate, at a position associated with a heating component located on the substrate, the mounting method comprising:

a mounting the heat radiating portion on the frame with use of the convex portion.

[Supplementary Note 19]

The mounting method according to claim 18, wherein the convex portion on an outer side of a mounting position of the heat radiating portion with respect to the frame, and wherein mounting the heat radiating portion on the frame in such a manner that the heat radiating portion is located on an inner side of the convex portion.

[Supplementary Note 20]

The mounting method according to claim 18, further comprising:

mounting a frame on the substrate, and coating a predetermined thermal interface material on a surface of the heat radiating portion to be mounted on the frame, wherein the mounting the heat radiating portion on the frame with use of the convex portion.

While the embodiments of this invention have been described in conjunction with the preferred embodiments described above, it will now be possible for those skilled in the art to put this invention into practice in various other manners.

What is claimed is:

1. A cooling device comprising:

a frame which is mounted on a substrate, the frame including a plurality of first convex portions, each of the plurality of first convex portions being a fin formed to project such that air to be fed by a fan is allowed to pass for cooling; and a first heat radiating portion which is mounted on the frame at a position associated with a first heating component located on the substrate, wherein a plurality of second convex portions is formed on the frame, on an inner side of a mounting position of the first heat radiating portion with respect to the frame, each of the plurality of second convex portions having a height which is lower than a height of each of the plurality of first convex portions, wherein at least one of the plurality of the first convex portions and the plurality of second convex portions is positioned at an upper portion of a position where a second heating component is positioned and radiates heat as a second heat radiating portion, wherein the second heating component is located at a different position on the substrate than the first heating component, wherein each of the plurality of the first convex portions faces each other and is arranged in a blowing direction of the fan, respectively on outer sides of both ends of the first heat radiating portion, and wherein each of the plurality of the second convex portions faces each other and is arranged in a blowing direction of the fan, respectively on inner sides of both ends of the plurality of the first convex portions and an outer sides of both ends of the first heat radiating portion.

2. The cooling device according to claim 1, wherein the plurality of the first convex portions is formed on an outer side of the mounting position of the first heat radiating portion on the frame.

3. The cooling device according to claim 2, wherein the frame includes an opening portion, and wherein the first heat radiating portion is connected to the first heating component via the opening portion of the frame.

4. The cooling device according to claim 3, wherein the plurality of the first convex portions is formed at positions whose distances from the opening portion are different from each other.

5. The cooling device according to claim 4, wherein the first heat radiating portion is rectangular in shape, wherein a distance from a first convex portion of the plurality of the first convex portions to the first heating component and a distance from another one of a first convex portion of the plurality of the first convex portions to the first heating component are different from each other.

6. The cooling device according to claim 5, wherein the first heat radiating portion includes a second fin for the first heat radiating portion, and wherein the second fin for the first heat radiating portion and the plurality of the first convex portions, each of which is a fin, are formed in such a manner that air is allowed to pass in a same direction as a direction of air generated by the fan.

7. The cooling device according to claim 1, wherein the frame includes an opening portion, and wherein the first heat radiating portion is connected to the first heating component via the opening portion of the frame.

8. The cooling, device according to claim 7, wherein the plurality of the first convex portions is formed at positions whose distances from the opening portion are different from each other.

9. The cooling device according to claim 1, wherein the first heat radiating portion is rectangular in shape, and a distance from one of the plurality of the first convex portions and the plurality of the second convex portions to the first heating component, and a distance from the other side of the plurality of the first convex portions and the plurality of the second convex portions to the first heating component are different from each other.

10. The cooling device according to claim 1, wherein the first heat radiating portion includes a second fin for the first heat radiating portion, and wherein the second fin for the first heat radiating portion and the plurality of the first convex portions, each of which is a fin, are formed in such a manner that air is allowed to pass in a same direction as a direction of air generated by the fan.

11. The cooling device according to claim 1, wherein the first heat radiating portion is formed at a position where the first heating component is located when the first heat radiating portion is mounted on the frame, the first heat radiating portion including a heat-radiating-portion-side first convex portion for cooling the first heating component, and a heat-radiating-portion-side second convex portion whose height is lower than a height of the heat-radiating-portion-side first convex, portion, and wherein the heat-radiating-portion-side second convex portion is formed on an outer side of a position where the first heat-radiating-portion is located when the first heat radiating portion is mounted on the frame.

12. The cooling device according to claim 11, wherein each of the plurality of the second convex portions is a fin formed to project in such a manner that air to be fed by the fan is allowed to pass.

13. The cooling device according to claim 1, wherein each of the plurality of the second convex portions is a fin formed to project in such a manner that air to be fed by the fan is allowed to pass.

14. A mounting method which mounts a first heat radiating portion on a frame forming a plurality of first convex portions, each of which is a fin formed to project such that air to be fed by a fan is allowed to pass for cooling a first heating component and a second heating component to be mounted on a substrate, at a position associated with the first and second heating components, the mounting method comprising:

mounting the first heat radiating portion on the frame with use of the plurality of the first convex portions, wherein a plurality of second convex portions is formed, on the frame, on an inner side of a mounting position of the first heat radiating portion with respect to the frame, each of the plurality of second convex portions having a height which is lower than a height of each of the plurality of first convex portions, wherein at least one of the plurality of the first convex portions and the plurality of the second convex portions is positioned at an upper portion of a position where the second heating component is positioned and radiates heat as a second heat radiating portion, wherein the second heating component is located at a different position on the substrate than the first heating component, wherein each of the plurality of the first convex portions faces each other and is arranged in a blowing direction of the fan, respectively on outer sides of both ends of the first heat radiating portion, and wherein each of the plurality of the second convex portions faces each other and is arranged in a blowing direction of the fan, respectively on inner sides of both ends of the plurality of the first convex portions and on outer sides of both ends of the first heat radiating portion.

15. The mounting method according to claim 14, wherein the plurality of the first convex portions is formed on an outer side of a mounting position of the first heat radiating portion with respect to the frame, and wherein the mounting of the first heat radiating portion on the frame is performed such that the first heat radiating portion is located on an inner side of the plurality of the first convex portions.

16. The mounting method according to claim 14, further comprising:

mounting the frame on the substrate, and coating a predetermined thermal interface material on a surface of the first heat radiating portion to be mounted on the frame, wherein the mounting of the first heat radiating portion on the frame is performed using the plurality of the first convex portions.

* * * * *

UNITED STATES PATENT AND TRADEMARK OFFICE
CERTIFICATE OF CORRECTION

PATENT NO. : 10,755,997 B2
APPLICATION NO. : 15/786869
DATED : August 25, 2020
INVENTOR(S) : Tomoyuki Mitsui Page 1 of 1

It is certified that error appears in the above-identified patent and that said Letters Patent is hereby corrected as shown below:

In the Specification

Column 11, Exemplary Embodiments, Line 29; Delete "openiAng" and insert --opening-- therefor Column 12, Exemplary Embodiments, Line 61; Before "mounting", delete "a"

In the Claims

Column 14, Line 20; In Claim 8, delete "cooling," and insert --cooling-- therefor Column 14, Line 50; In Claim 11, delete "convex," and insert --convex-- therefor Signed and Sealed this
Fifteenth Day of December, 2020

Andrei Iancu
*Director of the United States Patent and Trademark Office*